TRANSISTOR AMPLIFIER HAVING MEANS FOR COMPENSATING FOR NONLINEAR BASE-TO-EMITTER IMPEDANCE
Filed March 26, 1962
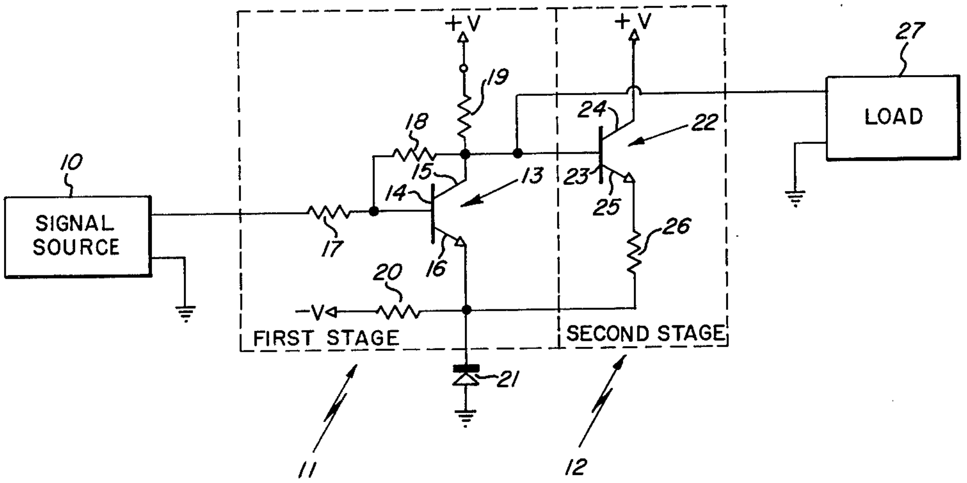
INVENTOR
ERNEST P. AUGER
BY Herbert W. Arnold
ATTORNEY

United States Patent Office 3,226,652
Patented Dec. 28, 1965

3,226,652

TRANSISTOR AMPLIFIER HAVING MEANS FOR COMPENSATING FOR NONLINEAR BASE-TO-EMITTER IMPEDANCE

Ernest P. Auger, Billerica, Mass., assignor to Raytheon Company, Lexington, Mass., a corporation of Delaware Filed Mar. 26, 1962, Ser. No. 182,293
6 Claims. (Cl. 330—24)

The present invention relates to semiconductor compensation techniques and, more particularly, to a device which makes use of an amplifier compensation technique which cancels out the effects produced by the nonlinearity of a transistor's base-to-emitter impedance.

Solutions for most of the problems encountered when designing a transjstor amplifier can be found in the literature. For example, low impedance, temperature compensated zener diodes are available to provide stable supply voltages, low temperature coefficient resistors are available to eliminate variation in resistance, and finally, negative feedback can be employed to limit the effect of variations in $\beta$ from both temperature and current variations by reducing the gain equations to ratios of the resistors in the circuit. However, there is one portion of an amplifier circuit which is very non-linear. It is the impedance between the base and the emitter of a transistor. For example, in a typical transistor, the base-to-emitter voltage may vary by thirty-five millivolts when the emitter current flowing is changed by ten milliamps.

It is acordingly an object of this invention to provide a new and improved transistor amplifier which compensates for the non-linear base-to-emitter impedance.

It is an additional object of this invention to provide an amplifier device which increases its linearity without decreasing its gain. It is a further object of the invention to provide a transistor amplifier circuit which limits the variations in the non-linear base-to-emitter voltage caused by variations in emitter current.

It is an additional objective of the invention to provide a device which simultaneously compensates for variations in both the base-to-emitter voltage caused by variations in emitter current and temperature.

It is a further object of this invention to provide a transistor device which retains its input circuit virtually at ground potential over a wide range of input currents.

It is an additional object of this invention to provide an amplifier which utilizes a series connecting diode feedback circuit to cancel out the variations in the non-linear base-to-emitter voltage of a transistor.

In accordance with this invention, a device for accomplishing this compensation technique comprises a first stage for amplifying an input signal, a semiconductor means in series opposition to said first stage, and a second stage which amplifies a portion of the output signal from said first stage. In addition, the device includes the novel feature of supplying to said semiconductor means a current from the second stage which cancels the effects of the non-linear impedance present in the input circuit of said first stage, so that the first stage's input circuit voltage variations are cancelled over a wide range of input currents.

For a better understanding of the present invention, together with other and further objectives thereof, reference is had to the following description taken in connection with the accompanying drawings and its scope will be pointed out in the appended claims.

Other objectives will become apparent from the following description taken in connection with the accompanying drawing, wherein:

The figure illustrates the general arrangement of a transistor-amplifier device, including an input signal source and an output load, which shows the compensation technique embodying the invention.

More particularly, there is shown an NPN transistor 13, having a base 14, a collector 15, and an emitter 16, comprising the active component of said first stage. The base 14 of transistor 13 is connected to an input resistor 17 and a biasing resistor 18. Connected to the collector 15 is the resistor 19, the load 27, and the other end of base 14 biasing resistor 18. Connected to the emitter 16 is the biasing resistor 20 and second-stage feedback resistor 26.

An NPN transistor 22, having a base 23, a collector 24, and an emitter 25, comprises the active component of a second transistor stage 12. Connected to the base 23 is the collector 15 of the transistor 13 and load 27. Connected to the emitter 25 is the other end of resistor 26. In addition, a diode 21 is connected to the emitter 16 of transistor 13 and resistor 26 to compensate for variations in the non-linear base-to-emitter impedance of transistor 13.

Considering now the operation of the transistor amplifier device and referring to the figure, when a first transistor stage 11 of an amplifier is constructed with a diode 21 in series opposition, an increase in the emitter 16 current of transistor 13 due to an input signal from signal source 10, would cause a decrease in the current flowing through diode 21. Such a decrease in diode 21 current would cause the linearity of device 11 to fall off, inasmuch as the voltage changes across transistor 13 and diode 21 would add. However, by tapping off from the collector 15 of transistor 13 a portion of the amplified input signal and amplifying this tapped signal portion by a second transistor stage 12, an out-of-phase voltage is obtained which is employed to supply the series opposition diode 21 with an additional current twice the magnitude of the increase in emitter 16 current and approximately 180 degrees out-of-phase with it. Thus, the reduction in current through diode 21 caused by the increase in emitter 16 current is first cancelled, and then the diode 21 current is further increased by an amount equal to the increase in emitter 16 current. This results in the series diode 21 current being made to equal the emitter 16 current for any value of emitter 16 current, thereby providing cancellation of the variations in voltage appearing across the non-linear base-to-emitter impedance of stage 11 over a wide range of input currents.

Referring again to the figure, during quiescent operation, the current flowing through resistor 26 of second stage 12, and the current flowing through emitter 16 of transistor 13 are in the reverse bias direction for diode 21. These currents are cancelled by a current flowing through resistor 20 of first stage 11, which, in addition, forward biases diode 21 with a current equal to the current flowing through emitter 16. In the presence of a positive input signal from signal source 10, the current flowing through emitter 16 will increase, thereby decreasing the current in diode 21 by an equal amount. At the same time, the collector 15 will become less positive, thereby decreasing the current flowing through resistor 26 and emitter 25 of transistor 22. Since the current flowing through resistor 26 is in a direction to reverse bias diode 21, the reduction in resistor 26 current thereby increases the net forward current in diode 21. If the resistor 26 is adjusted to change the current in diode 21 by an amount equal to twice the change caused by the variation in the emitter 16 current, the net result will be that the forward current in diode 21 will increase in an amount equal to the increase in emitter 16 current and thus provide voltage cancellation over a wide range of input current signals. This technique therefore provides for an increase in linearity, while either allowing for an increase in gain or a constant gain over a wide range of input currents by adjusting the values of the circuit components.

While it will be understood that the circuit specifications may vary according to the design for any particular application, the following circuit specifications are included for the illustrated circuit by way of example only:

| | |
|---|---|
| Transistors 13 and 14 | 2N706. |
| Diode 21 | IN914. |
| Resistor 17 | 1,000 ohms. |
| Resistor 20 | 15,000 ohms. |
| Resistor 19 | 910 ohms. |
| Resistor 26 | 250 ohms, |
| Resistor 18 | 1,000 ohms. |

Other embodiments of the invention can include PNP-type transistors in place of NPN transistors. This compensation technique also simultaneously cancels the variations in base-to-emitter voltage, due to temperature changes. This technique can be used in comparator or difference circuits where input currents are to be added. This technique has further applications, such as in chopper amplifiers, whereby linearity will be greatly improved by causing the currents in a conventional diode and an emitter diode to track, such that they are equal for all values of the applied input amplitude. In addition, this technique can be applied in the balanced modulator circuit to achieve increased linearity, in conjunction with the ability to reduce the unbalance currents normally supplied to the source or load. Accordingly, it is desired that this invention not be limited except as defined by the appended claims.

What is claimed is:

1. A transistor amplifier comprising:

a first signal amplifying stage having a first transistor including base and emitter electrodes and input and output terminals coupled to said first transistor;

a second signal amplifying stage having a second transistor and input and output terminals coupled to said second transistor;

means connecting to the output terminal of said first stage to the input terminal of said second stage; and, means for compensating for the nonlinear base-to-emitter impedance of said first stage including unidirectional current conducting means connected to said first stage in series opposition with the base-to-emitter junction of said first transistor, a source of current connected to said current conducting means for applying thereto a current substantially equal to the first transistor emitter current during quiescent operation of said first transistor, and negative feedback means connected between the output of said second stage and said current conducting means for providing a current to said current conducting means, said current being substantially equal to twice the decrease in current flow through said current conducting means caused by the nonlinearity of said base-to-emitter impedance.

2. A transistor amplifier comprising:

a first signal amplifying stage having a first transistor including base and emitter electrodes and an input and output terminal coupled to said first transistor;

a source of input signals connected to said input terminal;

a second amplifying stage having a second transistor and an input and output terminal coupled to said second transistor;

means coupling the output terminal of said first stage to the input terminal of said second stage; and, means for increasing the linearity of said first stage over a wide range of input signals without decreasing the gain of said amplifying stage including unidirectional semiconductor means connected to the base-to-emitter junction of said first stage in series opposition therewith, a source of current connected to said unidirectional semiconductor means for applying thereto a current substantially equal to the first transistor emitter current during quiescent operation of said first transistor, and negative feedback means connected between the output of said second stage and said semiconductor means for providing a current signal to said semiconductor means substantially equal to twice the current decrease through said semiconductor with an increase in the magnitude of said input signals.

3. A transistor amplifier comprising:

a first signal amplifying stage having a first transistor including base and emitter electrodes and an input and output terminal coupled to said first transistor;

a source of input signals connected to said input terminal;

a second amplifying stage having a second transistor and an input and output terminal coupled to said second transistor;

means coupling the output terminal of said first stage to the input terminal of said second stage; and, means for increasing the linearity of said first stage over a wide range of input signals without decreasing the gain of said amplifying stage including a source of reference potential, diode means connected between said source of reference potential and said first stage and being connected in series opposition with the base-to-emitter junction of said first stage, a source of current connected to said diode means for applying thereto a current substantially equal to the first transistor emitter current during quiescent operation of said first transistor, and second negative feedback means connected between the output of said second stage and said diode means for providing a current signal to said diode means substantially equal to twice the current decrease through said diode means with an increase in the magnitude of said input signals.

4. A linear amplifier comprising:

a semiconductor means having a base, emitter, and collector electrode;

a second amplifier means;

a source of input signals connected to said base;

means connecting the collector of said semiconductor means to said amplifier means; and, means for limiting the effective variation in the base-to-emiter voltage of said semiconductor means including a unidirectional semiconductor means connected in series opposition with the junction of said base and emitter electrodes such that the current through said unidirectional semiconductor decreases with an increase in emitter current, a source of current connected to said unidirectional means for applying thereto a current substantially equal to the current in said emitter during quiescent operation of said semiconductor means, and means connecting said second amplifier means to said unidirectional semiconductor means for providing a current signal to said unidirectional semiconductor means being substantially equal to twice said increase in emitter current.

5. A linear amplifier comprising:

a semiconductor means having a base, emitter, and collector electrode;

a source of input signals conected to said base;

output circuit means connected to said collector; and, means for limiting the effective variation of the base-to-emitter voltage of said semiconductor means including a source of reference potential, diode means connected between said emitter and source of reference potential and being in series opposition with the junction of said base and emitter electrodes such that an increase in said base-to-emitter voltage causes a decrease in voltage across said diode, a source of current connected to said diode for applying thereto a current substantially equal to the current in said emitter during quiescent operation of said semiconductor means, and means connected to said diode for providing a current signal to said diode sufficient to cause said diode voltage to be substantially equal to said base-to-emitter voltage.

6. A linear amplifier comprising:

a semiconductor means having a base, emitter, and collector electrode;

a source of input signals connected to said base;

a second amplifier means;

means connecting the collector of said semiconductor means to said amplifier means; and, means for simultaneously compensating for variations in temperature and the nonlinearity in the base-to-emitter impedance of said semiconductor means including a source of reference potential, diode means connected between said emitter and said source of reference potential and being in series opposition with the junction of said base and emitter electrodes, a source of current connected to said diode for applying a current to said diode substantially equal to the emitter current during quiescent operation of said semiconductor means, and negative feedback means connected between the output of said second amplifier and said diode for providing a current to said diode, said current being substantially equal to twice the decrease in current flow through said diode with an increase in emitter current.

References Cited by the Examiner

UNITED STATES PATENTS

| | | | |
|---|---|---|---|
| 2,871,305 | 1/1959 | Hurtig | 330—24 |
| 2,987,633 | 6/1961 | Pallas | 307—88.5 |
| 3,021,435 | 2/1962 | Keiper | 307—88.5 |
| 3,041,544 | 6/1962 | Lindsay | 330—24 |
| 3,067,344 | 12/1962 | Branum et al. | 307—88.5 |
| 3,130,329 | 4/1964 | Cother | 330—26 X |
| 3,135,897 | 6/1964 | Lee | 307—88.5 |

FOREIGN PATENTS

| | | |
|---|---|---|
| 216,799 | 8/1958 | Australia. |

ROY LAKE, *Primary Examiner.*

JOHN KOMINSKI, *Examiner.*